(12) United States Patent
Larsen

(10) Patent No.: US 8,421,518 B2
(45) Date of Patent: Apr. 16, 2013

(54) HIGH SPEED LEVEL SHIFTERS AND METHOD OF OPERATION

(75) Inventor: Christian Larsen, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 56 days.

(21) Appl. No.: 13/044,378

(22) Filed: Mar. 9, 2011

(65) Prior Publication Data

US 2012/0229189 A1 Sep. 13, 2012

(51) Int. Cl.
*H03L 5/00* (2006.01)
(52) U.S. Cl.
USPC .................. 327/333; 326/62; 326/81
(58) Field of Classification Search .............. 326/62–63, 326/80–82; 327/306, 333
See application file for complete search history.

(56) References Cited

U.S. PATENT DOCUMENTS

| | | | |
|---|---|---|---|
| 5,274,276 A | 12/1993 | Casper et al. | |
| 5,751,179 A | 5/1998 | Pietruszynski et al. | |
| 6,043,699 A * | 3/2000 | Shimizu | 327/333 |
| 6,184,716 B1 | 2/2001 | Depetro et al. | |
| 6,285,233 B1 | 9/2001 | Ribellino et al. | |
| 6,429,686 B1 | 8/2002 | Nguyen | |
| 6,518,818 B1 | 2/2003 | Hynes | |
| 6,762,645 B1 | 7/2004 | Grant | |
| 6,937,091 B2 | 8/2005 | Tanaka et al. | |
| 7,145,363 B2 * | 12/2006 | Kim | 326/68 |
| 7,271,639 B2 * | 9/2007 | Satou et al. | 327/333 |
| 7,710,183 B2 * | 5/2010 | Chaba et al. | 327/333 |
| 7,902,870 B1 * | 3/2011 | Jiang | 326/68 |
| 2005/0017755 A1 | 1/2005 | Chiang | |

FOREIGN PATENT DOCUMENTS

WO 2005078729 A2 8/2005

OTHER PUBLICATIONS

Berkhout, Marco; An Integrated 200-W Class-D Audio Amplifier, IEEE Journal of Solid-State Circuits, pp. 1198-1206; vol. 38, No. 7, Jul. 2003.
Korean Intellectual Property Office; International Search Report and Written Opinion; PCT Application No. PCT/US2010/024805; Sep. 28, 2010.

* cited by examiner

*Primary Examiner* — Dinh T. Le
(74) *Attorney, Agent, or Firm* — Jackson Walker L.L.P.; Christopher J. Rourk

(57) ABSTRACT

A circuit comprising an inverter coupled to an input and receiving an input signal. A first pull-down transistor coupled to the inverter, pulling down an output when the input signal is low. A second pull-down transistor coupled to the input, pulling down a complementary output when the input signal is high. A first pull-up transistor coupled to the complementary output, pulling up the output when the input signal is high. A second pull-up transistor coupled to the output, pulling up the complementary output when the input signal is low. A first switch receiving a first control signal, coupled to the complementary output. A first strong pull-up transistor coupled to the first switch, assisting the pull up of the output. A second switch coupled to the output, receiving a second control signal. A second strong pull-up transistor coupled to the second switch, assisting the pull up of the complementary output.

20 Claims, 14 Drawing Sheets

HIGH SPEED LEVEL SHIFTERS AND METHOD OF OPERATION

FIELD OF THE INVENTION

The disclosure relates generally to semiconductor circuits and specifically to level shifters.

BACKGROUND OF THE INVENTION

Level shifters receive a signal relative to a low supply voltage and a high supply voltage and produces an output signal similar to the received signal except that the output signal is relative to a second low supply voltage and a second high supply voltage. For example, a level shifter can receive a digital signal which swings between 0V and 3.3V and produce a digital output signal with the same high and low values except that the high value is 5V and the low value is 1.7V.

Level shifters can be employed in a wide variety of applications. They are used in class-D amplifier by amplifying the swing of a square wave form. They can be used in DC-DC power converters. Also, they can be used in interface circuits between different circuits which use different high or low reference voltages.

SUMMARY OF THE INVENTION

A level shifter comprising an inverter coupled to an input that can receive an input signal, a first pull-down transistor (such as an NFET) coupled to the inverter that can pull down an output when the input signal is low and a second pull-down transistor (such as an NFET) coupled to the input that can pull down a complementary output when the input signal is high. A first pull-up transistor (such as a PFET) is coupled to the complementary output and can pull up the output when the input signal is high, and a second pull-up transistor (such as a PFET) is coupled to the output and can pull up the complementary output when the input is low. A first switch is coupled to the complementary output and can receive a first control signal, and a first strong pull-up transistor (such as a PFET) is coupled to the first switch and can assist the pull up of the output. A second switch coupled to the output can receive a second control signal, and a second strong pull-up transistor (such as a PFET) is coupled to the second switch and can assist the pull up of the complementary output. When the first control signal is high, the first switch allows the first strong pull-up transistor to assist the pull up of the output. When the second control signal is high, the second switch allows the second strong pull-up transistor to assist the pull up of the complementary output.

In another exemplary embodiment, both strong pull-up transistors can be PFETs having switches coupling the gate and drain of each transistor. When the complement of their respective control signals is high, i.e., the control signal is low, the switches are closed causing each strong pull-up transistor to exhibit high impedance.

In another exemplary embodiment, both strong pull-up transistors can be coupled to the level shifter circuit through a switch. These switches can receive respective control signals which disconnect their respective strong pull-up transistors when the switches are not assisting in pulling up.

Another exemplary method includes driving an output and complementary output based on an input signal by pulling up the output to a high supply rail when the input signal is high. The output to a low supply rail is pulled down when the input signal is low, to pull down the complementary output to a high supply rail when the input signal is high. The complementary output is pulled up to a low supply rail when the input signal is low, to assist the pull-up of the output on the basis of a first control signal, and to assist the pull-up of the complementary output on the basis of a second control signal.

In both the level shifter and method, suitable embodiments of a control signal can be used. In one exemplary embodiment, the first control signal can be the input signal or a delayed version of the input signal and the second control signal can be the complement of the first control signal. In another exemplary embodiment, the first control signal can be the output signal and the second control signal can be the complementary output signal. In still another embodiment, the first control signal can be held high for a predetermined period after the input signal transitions from low to high and the second control signal can be held high for a predetermined period after the input signal transitions from high to low, to allow the level shifter to make the transition to the output signal.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION OF PREFERRED EMBODIMENTS

Figure 1:
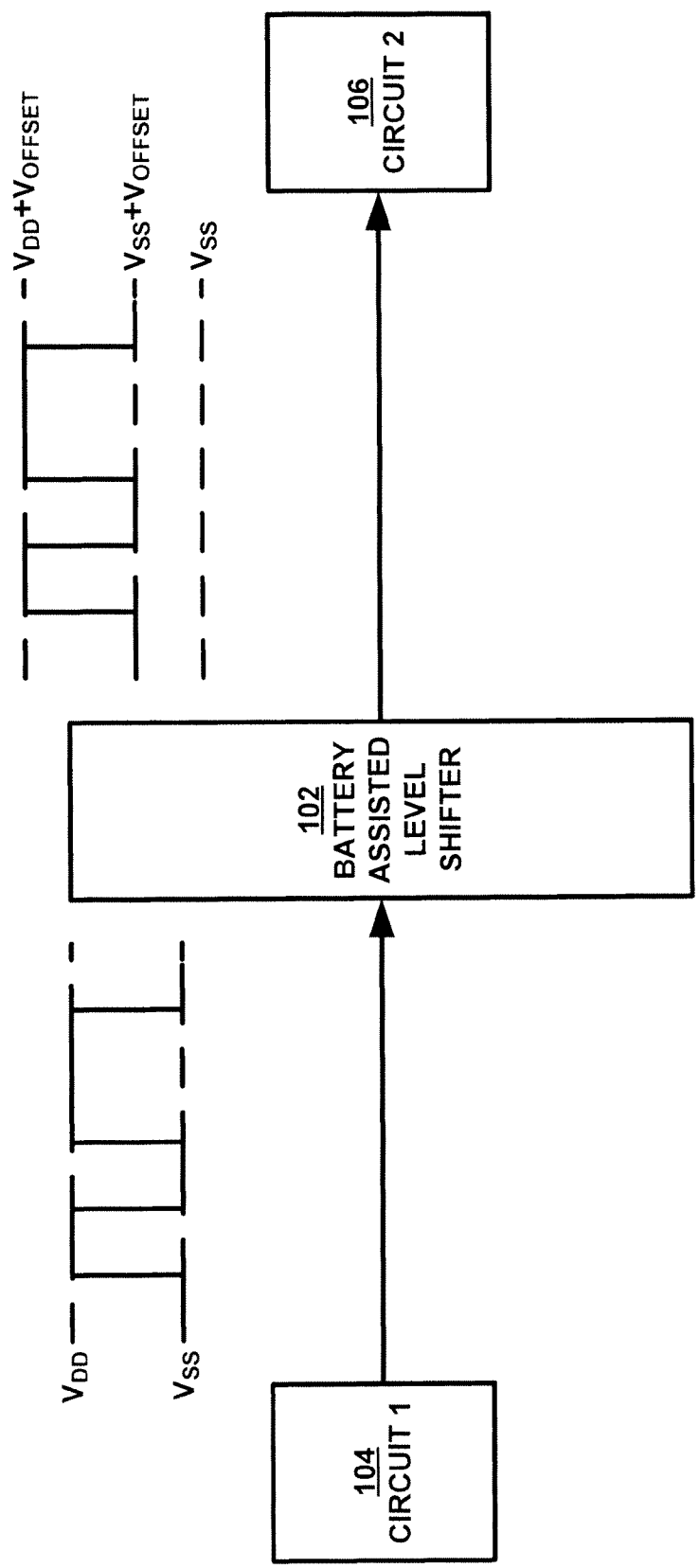
FIG. 1 is a block diagram showing a system comprising an exemplary embodiment of a battery-assisted level shifter.

In the description that follows, like parts are marked throughout the specification and drawings with the same reference numerals, respectively. The drawing figures might not be to scale and certain components can be shown in generalized or schematic form and identified by commercial designations in the interest of clarity and conciseness.

A detailed description of embodiments of the present disclosure is presented below. While the disclosure will be described in connection with these drawings, there is no intent to limit it to the embodiment or embodiments disclosed herein. On the contrary, the intent is to cover all alternatives, modifications and equivalents included within the spirit and scope of the disclosure as defined by the appended claims.

Battery assisted level shifters can be used in a wide variety of applications, including class-D amplifiers, DC-DC power conversion and interfacing between circuits using different voltage tolerances or different reference voltages.

FIG. 1 is a block diagram showing a system comprising an exemplary embodiment of a battery-assisted level shifter of a first type. Battery assisted level shifter 102 receives a first signal from circuit 104 that swings from $V_{SS}$ to $V_{DD}$. Battery assisted level shifter 102 generates a second signal that is provided to circuit 106, where the second signal is essentially the same as the input signal except that an offset of $V_{offset}$ is added to the output signal. The result is an output signal which swings from $V_{SS}+V_{offset}$ to $V_{DD}+V_{offset}$.

Figure 2:
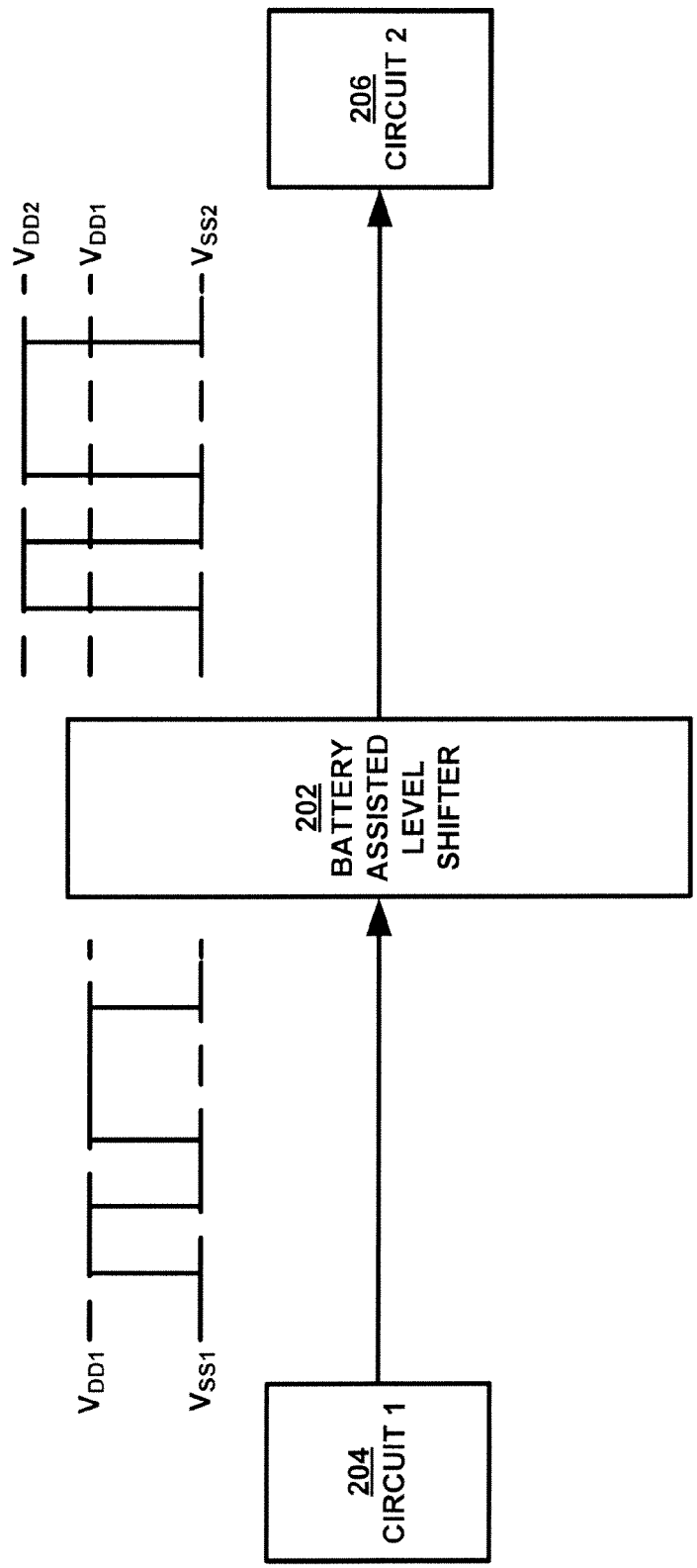
FIG. 2 is a block diagram showing a system comprising another exemplary embodiment of a battery-assisted level shifter.

FIG. 2 is a block diagram showing a system comprising an exemplary embodiment of a battery assisted level shifter of a second type. Battery assisted level shifter 202 receives a first signal from circuit 204 that swings from $V_{SS1}$ to $V_{DD1}$. Battery assisted level shifter 202 generates a second signal that is provided to circuit 206, where the second signal is essentially the same as the first signal except the output signal swings from $V_{SS2}$ to $V_{DD2}$. Though $V_{DD1}$ and $V_{DD2}$ can be different values, quite often $V_{SS1}$ and $V_{SS2}$ are the same and tied to ground. In such a circumstance, battery assisted level shifter 202 amplifies or attenuates the voltage of the input signal by a fixed factor. As illustrated in the following examples, level shifters of the first type can be used to construct a level shifter of the second type.

Figure 3:
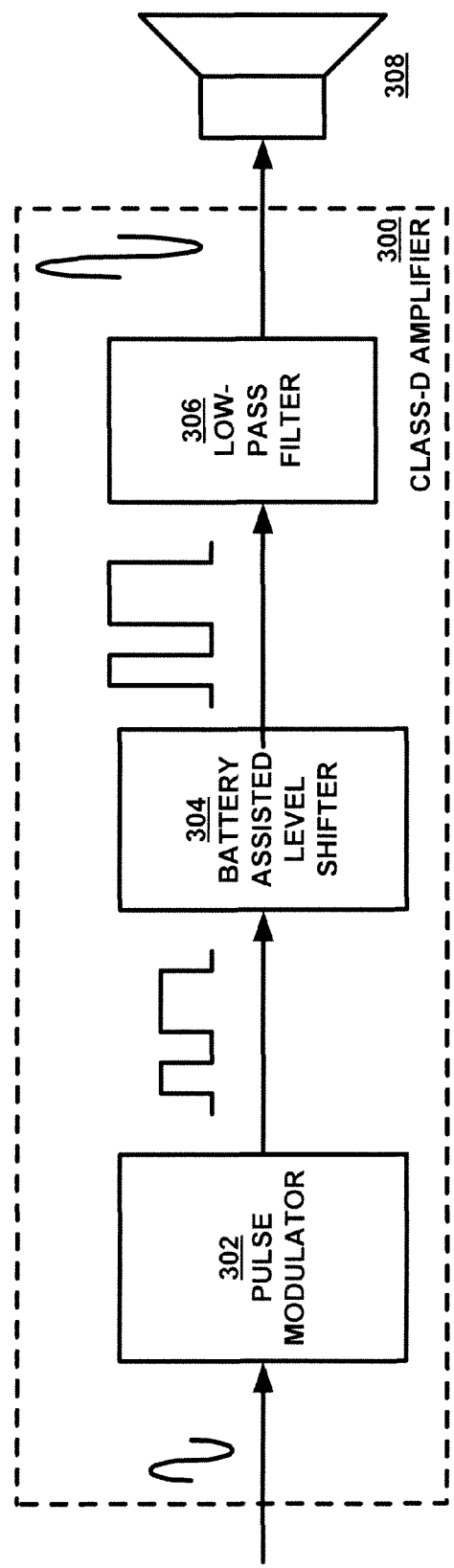
FIG. 3 is a block diagram of an exemplary embodiment of a class-D amplifier utilizing a battery-assisted level shifter.

FIG. 3 is a block diagram of an exemplary embodiment of a class-D amplifier that utilizes a battery-assisted level shifter. Optionally, class D-amplifier 300 receives an analog input signal that is converted to pulses using modulator 302. Most commonly in analog operations, modulator 302 is either a pulse width modulator or a pulse density modulator. A common implementation of a pulse width modulator uses a high speed comparator to compare the input signal against a triangle wave. In digital audio applications, a digital audio signal is received and is converted into a pulse width signal or a pulse density signal by a digital signal processor, thus avoiding the need for analog circuitry prior to amplification.

The modulated signal is then amplified by battery assisted level shifter 304 and finally demodulated by low pass filter 306. The demodulated signal can then be used, for example, by speaker 308. In particular, battery assisted level shifter 304 can be implemented with a battery assisted level shifter such as battery assisted level shifter 202.

Figure 4:
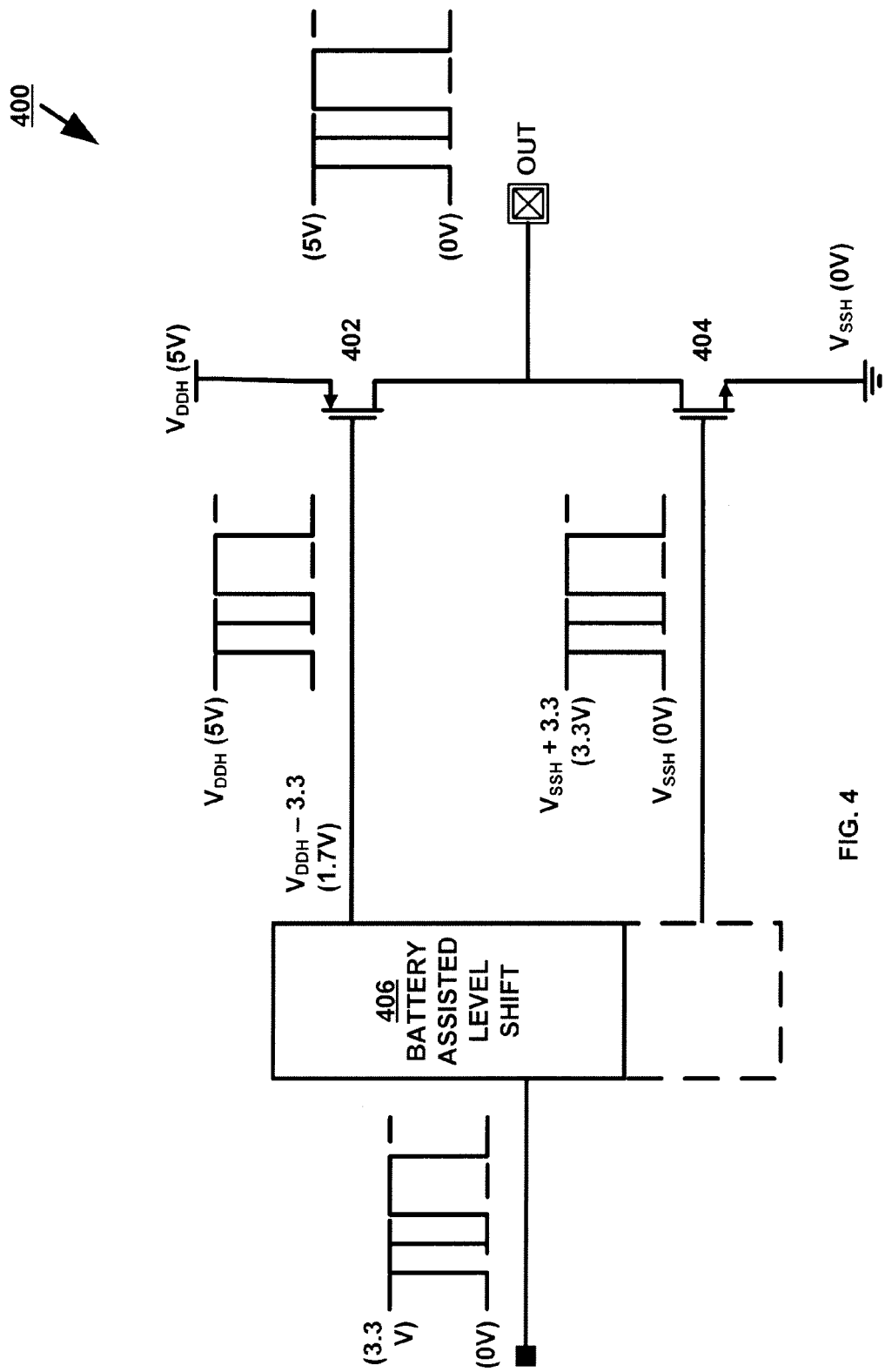
FIG. 4 illustrates an output stage of an exemplary power driver.

FIG. 4 illustrates an output stage of an exemplary power driver 400, as previously disclosed in U.S. patent application Ser. No. 12/390,333, entitled "Systems and Methods for Driving High Power Stages Using Lower Voltage Processes," filed on Feb. 20, 2009 which is incorporated by reference herein for all purposes. FIG. 4 illustrates an output stage of a power driver. Integrated power drivers such as Class-D amplifiers as described above and DC-DC converters are the output stages which typically use a complementary MOS structure. Output stage 400 comprises a high-side switch (shown as p-type field effect transistor (PFET) 402), a low-side switch (shown as n-type field effect transistor (NFET) 404) and battery assisted level shifter 406. When high-side switch 402 is in the ON state and NFET 404 is in the OFF state, the output voltage is pulled up to the $V_{DDH}$ level. When high-side switch 402 is in the OFF state and the NFET 404 is in the ON state, the output voltage is pulled down to the $V_{SSH}$ level. As is typical with PFET switches, the PFET is in the ON state when the gate voltage is at least one PFET threshold below its source and is OFF when the gate-to-source voltage is zero. Similarly, as is typically the case with NFET switches, the NFET is in the ON state when the gate voltage is at least one NFET threshold above its source and is OFF when the gate-to-source voltage is zero.

The output voltage swing produced by a class-D amplifier depends on the requirements imposed by the end product. For example, in PC audio applications speaker drivers are rated to produce an average power of 2.5 W on a 4-Ω speaker, a 5V swing can be used to allow the class-D amplifier to generate 2.5 W. Alternatively, many advanced integration technologies use 0.35 μm or smaller geometries, which constrains the voltage withstand of the FET devices to 3.3V. In order to meet this voltage withstand level when the source of high-side switch 402 is tied to the power rail $V_{DDH}$, the control signal supplied to the gate of high-side switch 402 can only be allowed to drop 3.3V below $V_{DDH}$. For the case where $V_{DDH}$ is set to 5V, the gate cannot go below 1.7V. Similarly, the control signal supplied to the gate of low-side switch 404 can only be allowed to go 3.3V above $V_{SSH}$ for the case where $V_{SSH}$ is set to ground (0V).

In FIG. 4, battery assisted level shifter 406 is used to shift a modulated signal so that the swing between the power supply voltage $V_{DDH}$ and the gate of high-side switch 402 never exceeds 3.3V. Additionally, battery assisted level shifter 406 can also be used to supply the gate voltage to low-side switch 404 such that the swing between the gate and power supply voltage $V_{SSH}$ never exceeds 3.3V. However, the original modulated signal can also be supplied directly to low-side switch 404.

Figure 5:
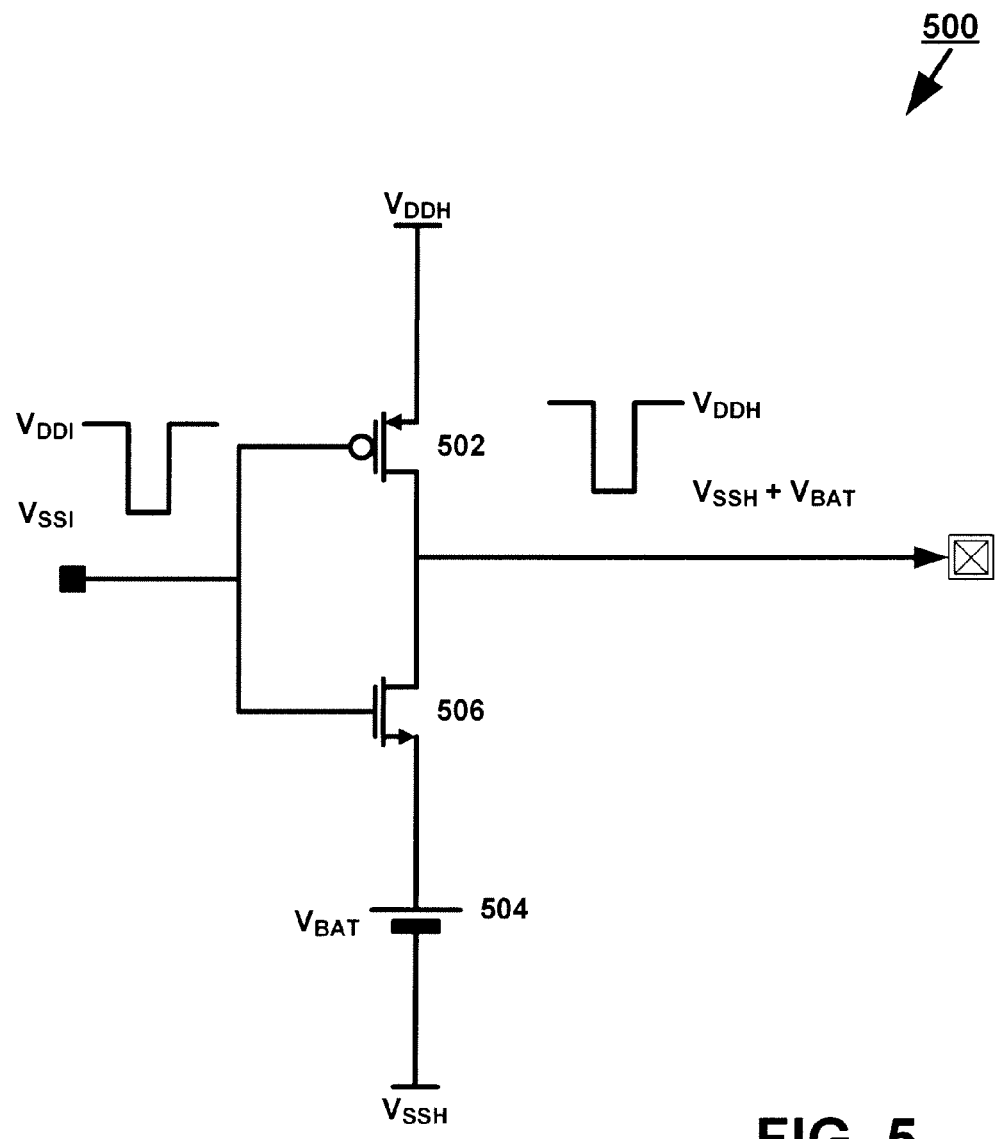
FIG. 5 is a circuit diagram of an exemplary embodiment of a battery assisted level-shifter.

FIG. 5 is a circuit diagram of an exemplary embodiment of a battery assisted level-shifter. Battery assisted level shifter 500 comprises a pull-up transistor (shown as PFET 502), a pull-down transistor (shown as NFET 506) and battery element 504. The source of PFET 502 is coupled to the drain of NFET 506, and the gates of PFET 502 and NFET 506 are coupled together. Battery element 504 has a positive terminal coupled to NFET 506 and a negative terminal coupled to the low supply rail. A single gate signal can be provided to PFET 502 and NFET 506 to allow PFET 502 and NFET 506 to alternate on/off states.

When PFET 502 is switched ON, it pulls output voltage $V_{OUT}$ up to the voltage supplied by the high supply rail, which has a high supply voltage denoted by $V_{DDH}$. When NFET 506 is switched ON, it pulls output voltage $V_{OUT}$ down to the voltage supplied by the low supply rail plus the voltage across battery element 504, denoted by $V_{BAT}$. Here, the low supply voltage is denoted by $V_{SSH}$ and is sometimes set to the ground potential. Battery element 504 maintains its voltage $V_{BAT}$ across its two terminals regardless of the current that is drawn through it under design operating conditions. If battery assisted level shifter 500 is used in output stage 400 described above, the voltage across battery element 504 can be selected to maximize the swing of the output $V_{OUT}$. The voltage $V_{OUT}$ is supplied to high-side switch 402, which swings between $V_{DDH}$ and $V_{SSH}+V_{BAT}$. A nominal choice of 1.7V for $V_{BAT}$ optimizes the voltage swing across high side switch 402 switches to 3.3V for the case of $V_{DDH}=5.0V$ and $V_{SSH}=0.0V$.

Figure 6:
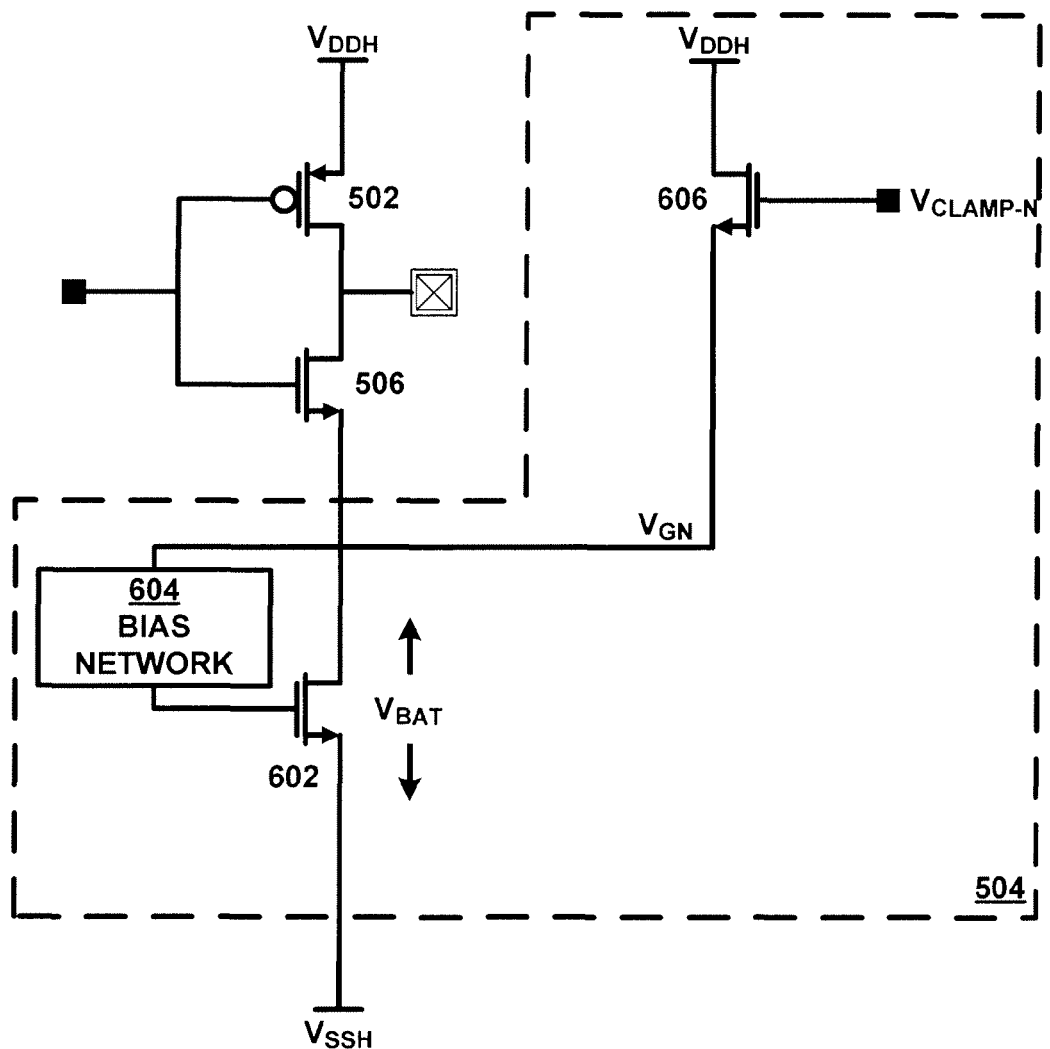
FIG. 6 is a circuit diagram of an exemplary embodiment of a battery assisted level shifter with an embodiment of a battery element shown in greater detail.

FIG. 6 is a circuit diagram of an exemplary embodiment of battery assisted level shifter 500 with an embodiment of battery element 504 shown in greater detail. In this embodiment, battery element 504 comprises a battery transistor (shown as NFET 602), bias network 604 and a clamping transistor (shown as NFET 606). Bias network 604 provides a voltage of $V_{BAT}-V_{thn}$ between the drain and gate of NFET 602, where $V_{thn}$ is the threshold of NFET 602. When NFET 602 has a drain-to-source voltage greater than $V_{BAT}$, NFET 602 turns ON. When NFET 602 has a drain-to-source voltage less than $V_{BAT}$, NFET 602 turns OFF. These two factors cause NFET 602 to maintain a drain-to-source voltage of $V_{BAT}$.

Clamping NFET 606 is connected between $V_{DDH}$ and $V_{gn}$ and is designed to turn on when $V_{gn}$ drops below the target voltage $V_{DDH}-V_{swing}$, and thus prevents $V_{BAT}$ from dropping further below the target voltage. This operation is achieved by setting clamping voltage $V_{clamp-N}=V_{DDH}-V_{swing}+V_{thn}$.

When the control signal received by NFET 506 and PFET 502 transitions from low to high, NFET 506 turns ON and at the same time PFET 502 turns OFF. NFET 506 pulls down the voltage $V_{OUT}$ towards $V_{BAT}$. This initially causes the voltage across NFET 602 to exceed $V_{BAT}$, so NFET 602 turns ON and pulls down the voltage $V_{gn}$. Similarly, when the control signal received by NFET 506 and PFET 502 transitions from high to low, NFET 506 turns OFF and at the same time PFET 502 turns ON. PFET 502 pulls up the voltage $V_{OUT}$ towards $V_{DDH}$.

Figure 7:
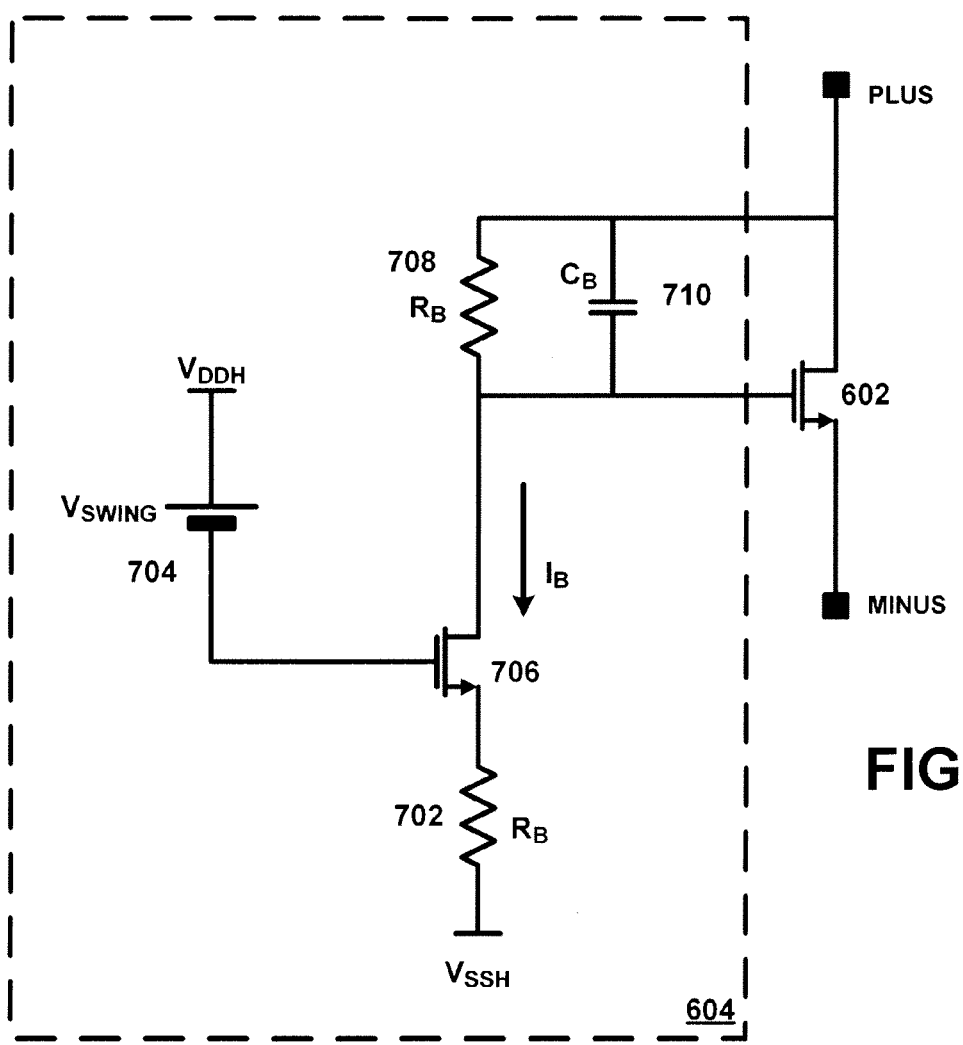
FIG. 7 is a circuit diagram of an exemplary embodiment of a bias network.

FIG. 7 is a circuit diagram of an exemplary embodiment of a bias network. In this example, bias network 604 comprises bias resistor 702, a current source transistor (shown as NFET 706), voltage source 704, and an RC circuit comprising resistor 708 and capacitor 710. The gate voltage for NFET 706 is $V_{DDH}-V_{swing}$ so the source voltage of NFET 706 is $V_{DDH}-V_{swing}-V_{thn}$, leaving a net voltage across resistor 702 of $V_{DDH}-V_{swing}-V_{thn}-V_{SSH}$. Bias resistor 702 and resistor 708 have the same resistance Rb and since the same current $I_b$ is drawn through both resistors, resistor 708 also has a net voltage of $V_{DDH}-V_{swing}-V_{thn}-V_{SSH}$ across it. This insures that NFET 602 only switches ON when the drain to source voltage exceeds $V_{DDH}-V_{swing}-V_{SSH}$, the desired $V_{BAT}$ voltage. Capacitor 710 is added to maintain a constant voltage on resistor 708 during signal transitions.

Bias network 604 as shown in FIG. 7 maintains a gate voltage of $V_{DDH}-V_{swing}-V_{thn}-V_{SSH}$ to NFET 602, causing NFET 602 to maintain a voltage of $V_{BAT}=V_{DDH}-V_{swing}-V_{SSH}$. When the control signal is high, $V_{OUT}$ is $V_{DDH}$, and when the control signal is low, $V_{OUT}$ is $V_{DDH}-V_{swing}$. Therefore, the net swing of $V_{OUT}$ is equal to the target swing voltage $V_{swing}$, even if the supply voltages vary as a result of process, voltage and temperature (PVT) variations. In this way, battery assisted level shifter 500 can be configured with a target swing voltage which does not vary as a result of PVT variations.

Figure 8:
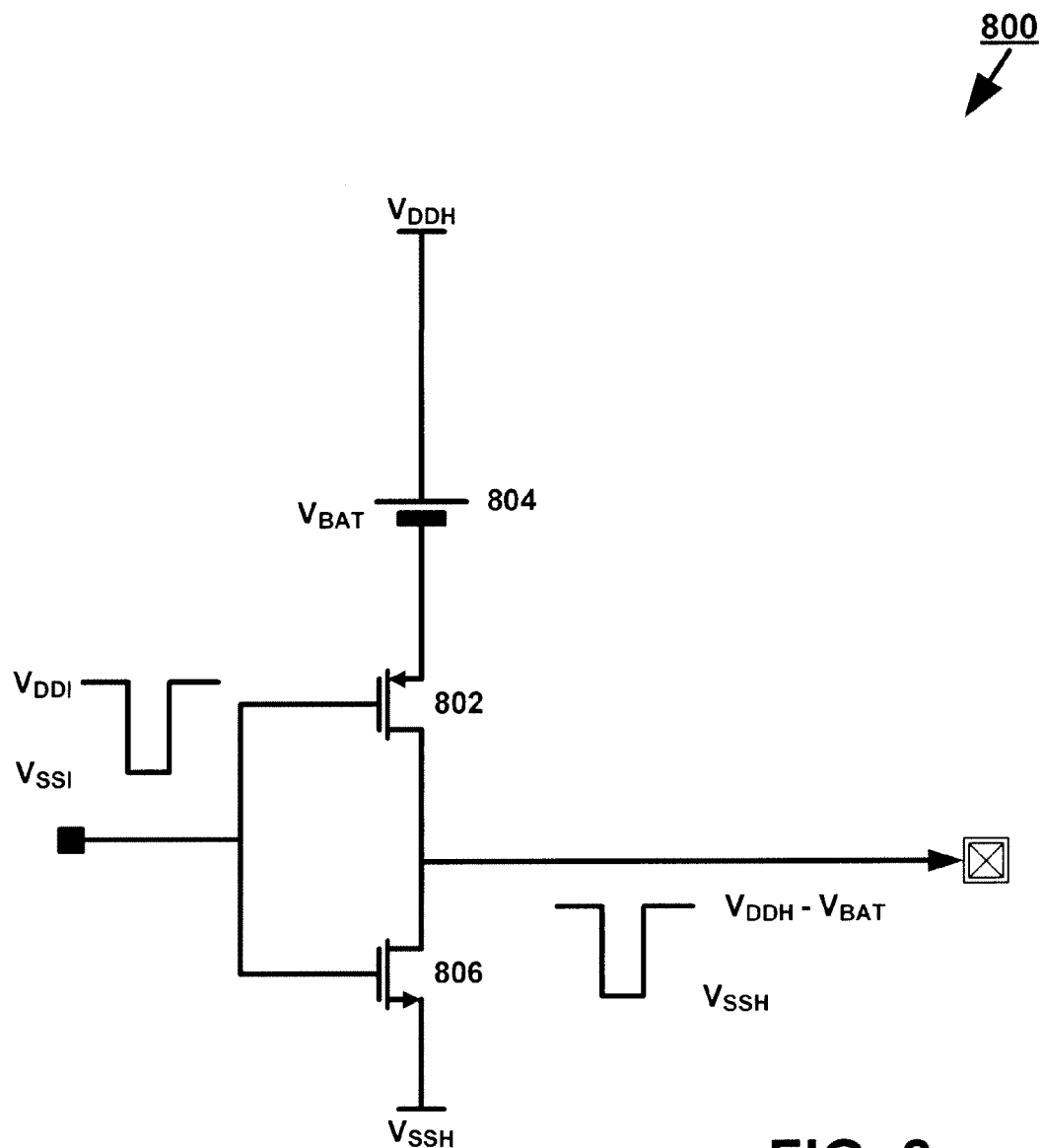
FIG. 8 is a circuit diagram of another exemplary embodiment of a battery assisted level-shifter.

FIG. 8 is a circuit diagram of another exemplary embodiment of a battery assisted level shifter. Battery assisted level shifter 800 comprises a pull-up transistor (shown as PFET 802), a pull-down transistor (shown as NFET 806) and battery element 804. Battery element 804 has a negative terminal coupled to PFET 802 and a positive terminal coupled to the high supply rail. When PFET 802 is switched on, it pulls output voltage $V_{OUT}$ up to the voltage supplied by the high supply rail, minus the voltage across battery element 804 (denoted by $V_{BAT}$). The high supply voltage is denoted by $V_{DDH}$. When NFET 806 is switched on, it pulls output voltage $V_{OUT}$ down to the voltage supplied by the low supply rail (denoted by $V_{SSH}$), which can be set to the ground potential or other suitable values. Battery element 804 maintains the voltage $V_{BAT}$ across its two terminals regardless of the current that is drawn through it under design operating conditions. Battery assisted level shifter 800 is a complementary circuit to battery assisted level shifter 500. If the input signals which are used as the control signal to NFET 806 and PFET 802 swing from $V_{SSI}$ to $V_{DDI}$, battery assisted level shifter 800 converts that signal to an output signal that swings from $V_{DDH}-V_{BAT}$ to $V_{SSH}$. If $V_{BAT}$ is configured to equal $V_{DDH}-V_{swing}-V_{SSH}$, then the output of battery assisted level shifter 800 swings from $V_{SSH}$ to $V_{SSH}+V_{swing}$. Therefore, battery assisted level shifter 800 can be configured with a target swing voltage $V_{swing}$ which is not sensitive to variations in the supply voltages. Battery element 804 differs from battery element 504 as shown.

Figure 9:
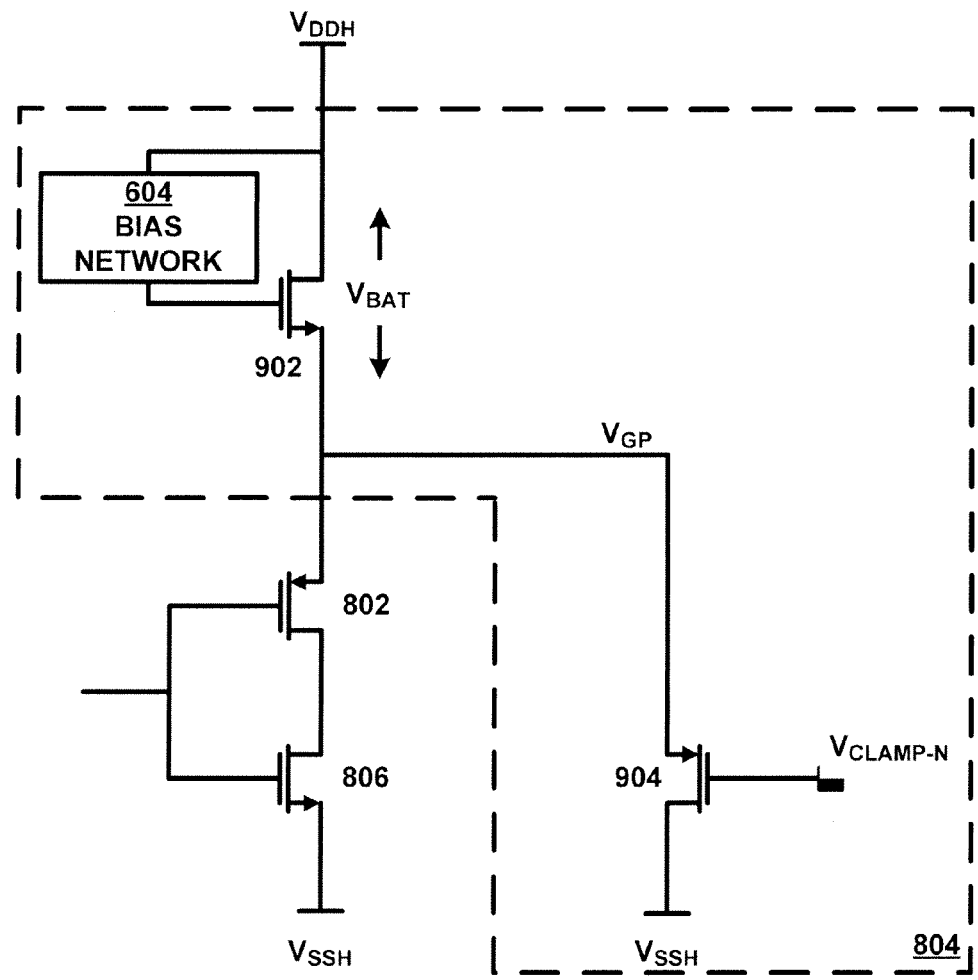
FIG. 9 is a circuit diagram of an exemplary embodiment of a battery assisted level shifter with an exemplary embodiment of battery element shown in greater detail.

FIG. 9 is a circuit diagram of the embodiment of battery assisted level shifter 800 with an embodiment of battery element 804 shown in greater detail. In this embodiment, battery element 804 comprises a battery transistor (shown as NFET 902), bias network 604 and a clamping transistor (shown as NFET 904). Bias network 604 provides a voltage of $V_{BAT}-V_{thn}$ between the drain and gate of NFET 902, where $V_{thn}$ is the threshold of NFET 902. When NFET 902 has a drain-to-source voltage greater than $V_{BAT}$, NFET 902 turns ON. When NFET 902 has a drain-to-source voltage less than $V_{BAT}$, NFET 902 turns OFF. These two factors cause NFET 902 to maintain a drain-to-source voltage of $V_{BAT}$. Bias network 604 functions as described above.

Clamping NFET 904 is connected between $V_{SSH}$ and $V_{gp}$ and is designed to turn on when $V_{gp}$ rises above its target voltage, $V_{SSH}+V_{swing}$, to prevent $V_{BAT}$ from dropping below the target voltage. This state is achieved by setting clamping voltage $V_{clamp-p}=V_{SSH}+V_{swing}-V_{thp}$, where $V_{thp}$ is the threshold voltage of PFET 902. Because bias network 604 can maintain a battery voltage of $V_{DDH}-V_{swing}-V_{SSH}$, the output to battery assisted level shifter 800 can have a target swing voltage of $V_{swing}$ even under variations in the power supply voltages attributable to PVT variations.

Figure 10:
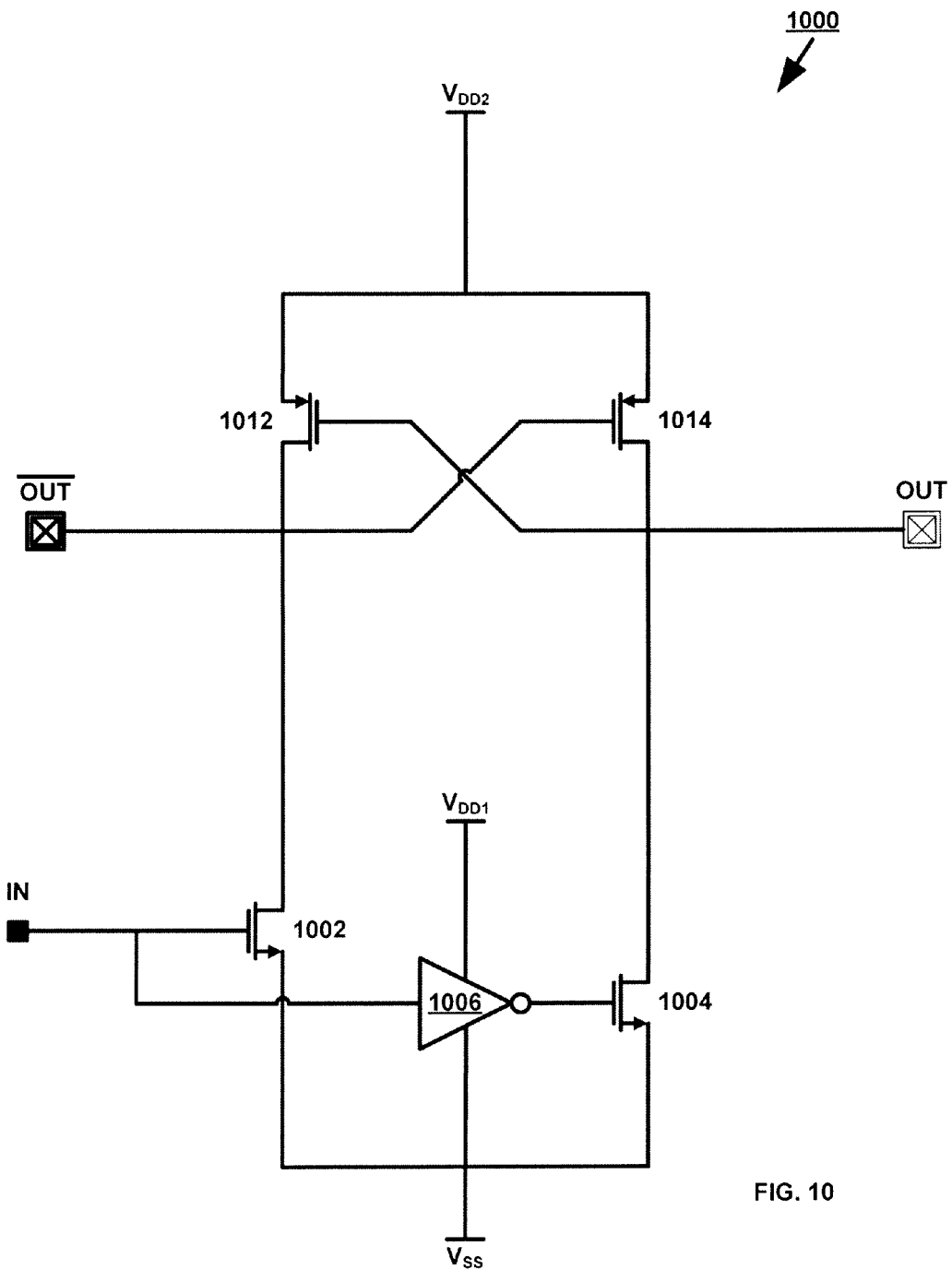
FIG. 10 shows an exemplary embodiment of a battery assisted level shifter.

FIG. 10 shows an exemplary embodiment of a battery assisted level shifter. Battery assisted level shifter 1000 comprises pull down transistors 1002 and 1004 (shown as NFETs), inverter 1006 and pull up transistors 1012 and 1014 (shown as PFETs). The input signal IN operates between 0 and $V_{DD1}$ and the resultant output signal OUT operates between 0 and $V_{DD2}$. The voltage at the drain of pull down NFET 1204 supplies the output signal OUT while the voltage at the drain of pull down NFET 1202 supplies the complementary output signal $\overline{OUT}$.

When the input signal is high, the gate voltage of NFET 1002 is high and the gate voltage of NFET 1004 is low. This state turns on NFET 1002 and turns off NFET 1004. Because NFET 1002 is turned on, the drain voltage of NFET 1002 is pulled to $V_{SS}$ and consequently, the gate voltage of PFET 1014 is low, turning on PFET 1014. PFET 1014 can pull up signal OUT because NFET 1004 is turned off. At the same time, because PFET 1014 pulls up OUT, which is also the gate voltage of PFET 1012, PFET 1012 is turned off, enabling NFET 1002 to pull down signal $\overline{OUT}$.

When the input signal is low, the gate voltage of NFET 1002 is low and the gate voltage of NFET 1004 is high, turning NFET 1002 off and NFET 1004 on. Because NFET 1004 is turned on, the drain voltage of NFET 1004 is pulled to $V_{SS}$ and consequently the gate voltage of PFET 1012 is low, turning on PFET 1012. PFET 1012 pulls up signal $\overline{OUT}$ because NFET 1002 is turned off. At the same time, because PFET 1012 pulls up $\overline{OUT}$ (which is also the gate voltage of PFET 1014), PFET 1014 is turned off, enabling NFET 1004 to pull down signal OUT.

Each time one of the NFETs turns on, it also pulls down on the source of a PFET. However, to do this quickly, the NFET would have to draw a great amount of current (sometimes referred to as shoot-through current) during the high to low transition. The amount of current is dependent on the impedance of the PFET when turned off. If the impedance is high, the NFET would need less current. However, even though a small PFET has high impedance, it would have more difficulty pulling up the voltage in the low to high transition.

Figure 11:
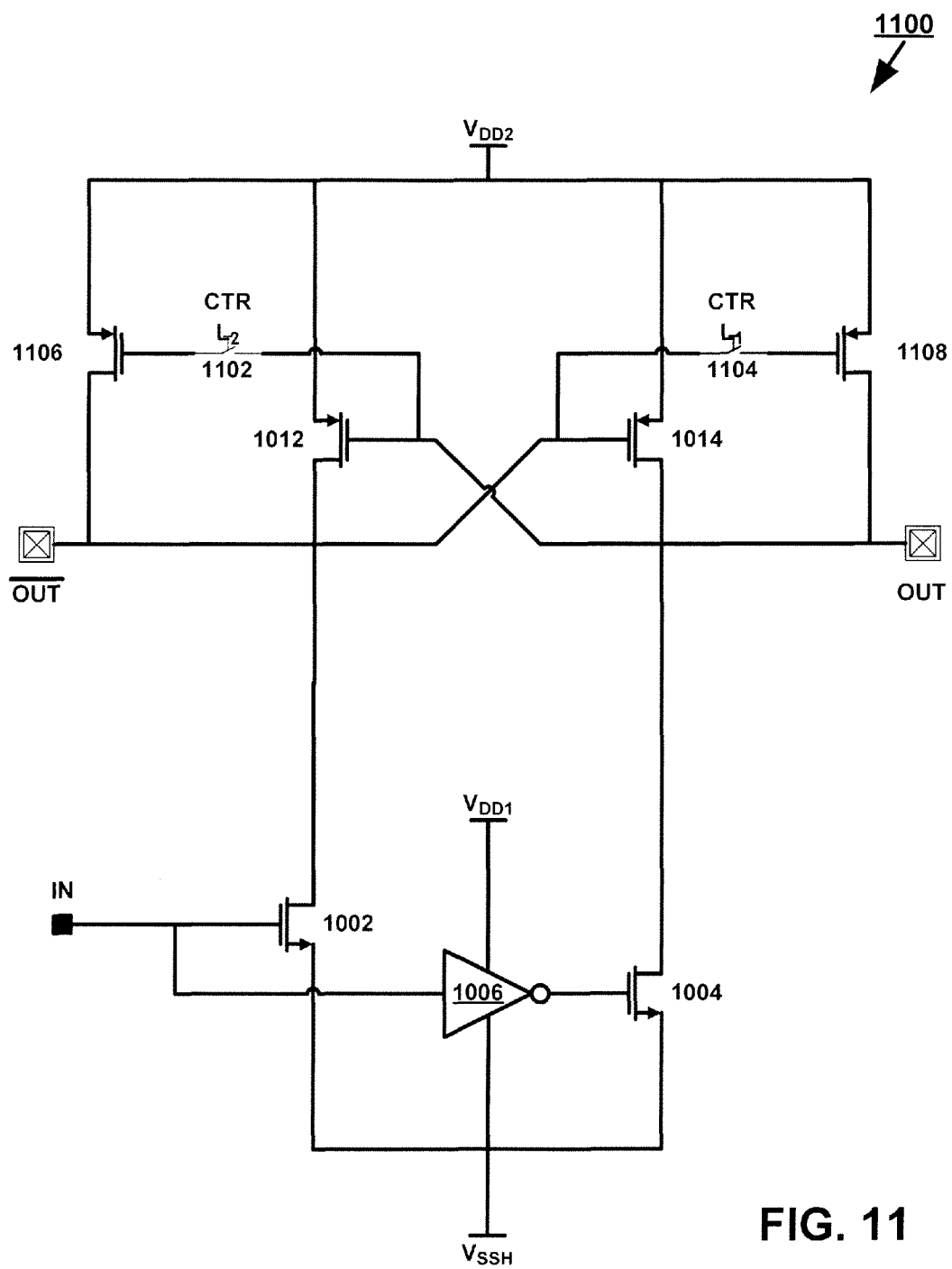
FIG. 11 shows another exemplary embodiment of a battery assisted level shifter.

FIG. 11 shows another exemplary embodiment of a battery assisted level shifter. Like battery assisted level shifter 1000, battery assisted level shifter 1100 comprises pull down NFETs 1002 and 1004, inverter 1006 and pull up PFETs 1012 and 1014. Battery assisted level shifter 1100 further comprises "strong" pull up transistors (shown as PFETs 1106 and 1108) and switches 1102 and 1104. When the input signal is high, the gate voltage to PFET 1014 is high, turning on PFET 1014 at approximately the same time control signal ctrl; goes high, causing switch 1104 to close and activating PFET 1108. This state allows PFET 1108 to aid PFET 1014 in pulling up OUT. Similarly when the input signal is low, the gate voltage to PFET 1012 is high, turning on PFET 1012 at approximately the same time control signal $ctrl_2$ goes high, causing switch 1102 to close activating PFET 1106. This state allows PFET 1106 to aid PFET 1012 in pulling up $\overline{OUT}$. Strong PFETs 1106 and 1108 are often larger than their counterparts PFET 1012 and PFET 1014, in order to provide lower impedance and faster pull up capabilities. While strong pull up PFETs 1106 and 1108 can assist PFETs 1012 and 1014 in pulling up voltages $\overline{OUT}$ and OUT, respectively, because of their lower impedance, current is still drawn through them even when they are not activated.

Figure 12:
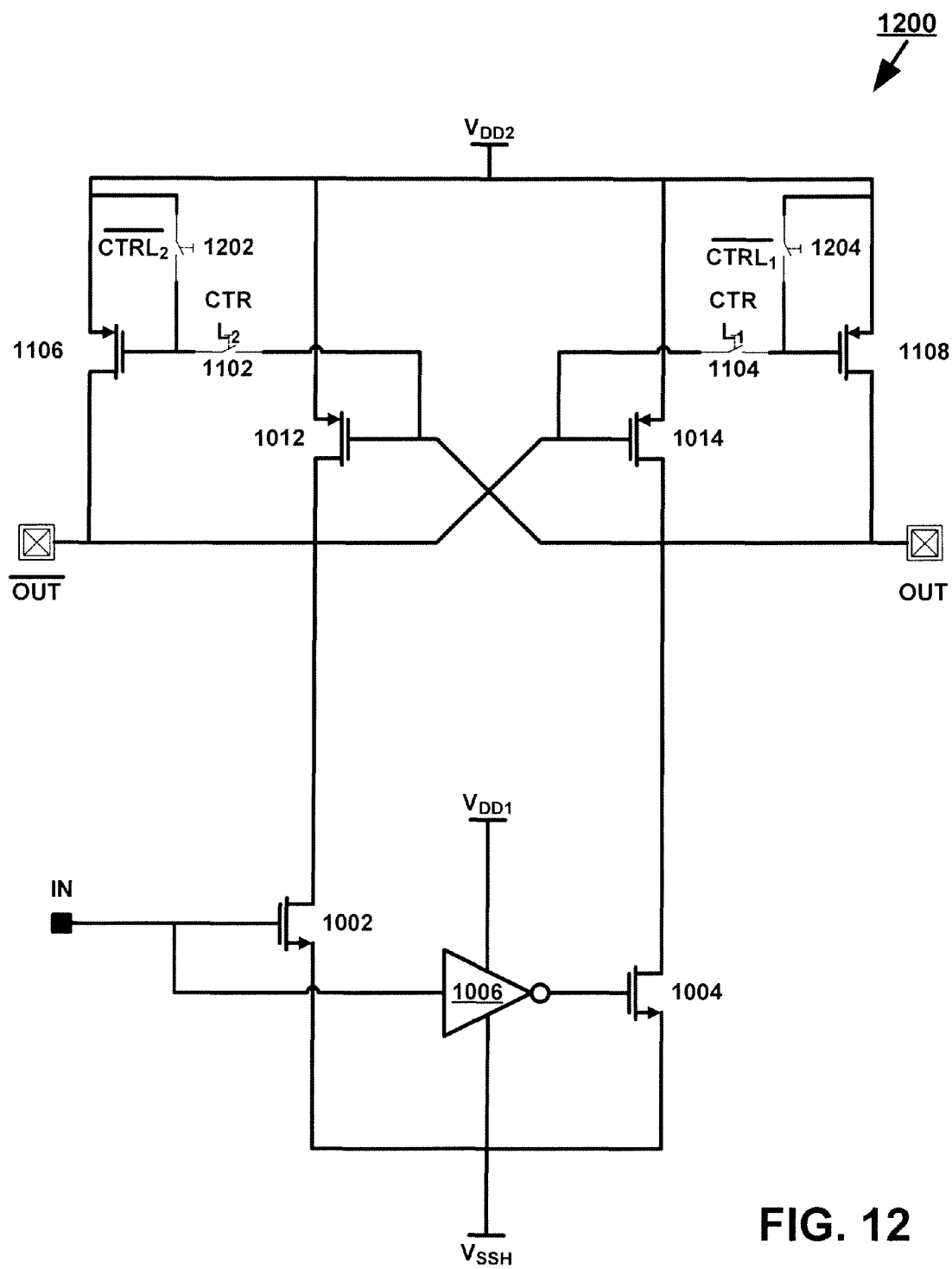
FIG. 12 shows yet another exemplary embodiment of a battery assisted level shifter.

FIG. 12 shows yet another exemplary embodiment of a battery assisted level shifter. Like battery assisted level shifter 1100, battery assisted level shifter 1200 comprises pull down NFETs 1002 and 1004, inverter 1006, pull up PFETs 1012 and 1014, strong pull up PFETs 1106 and 1108 and switches 1102 and 1104. Battery assisted level shifter 1200 further comprises switches 1202 and 1204. When the input signal is high, the gate voltage to PFET 1014 is high, turning on PFET 1014. At approximately the same time, control signal $ctrl_1$ goes high and causes switch 1104 to close, activating PFET 1108. This state allows PFET 1108 to aid PFET 1014 in pulling up OUT. Meanwhile, NFET 1002 pulling down $\overline{OUT}$, but it only has to pull down against the impedance of PFET 1012 because control signal $\overline{ctrl_2}$ as received by switch 1202 is high. This state ties the gate and drain of PFET 1106 together, forcing PFET 1106 into a high impedance state. When the input signal is low, the gate voltage to PFET 1012 is high turning on PFET 1012. At approximately the same time, control signal $ctrl_2$ causes switch 1102 to close and activate PFET 1106. This state allows PFET 1106 to aid PFET 1012 in pulling up $\overline{OUT}$. Meanwhile, NFET 1004 pulls down OUT but only has to pull down against the impedance of PFET 1014, because control signal $\overline{ctrl_1}$ as received by switch 1204 is high. This state ties the gate and drain of PFET 1108 together, forcing PFET 1108 into a high impedance state.

Figure 13:
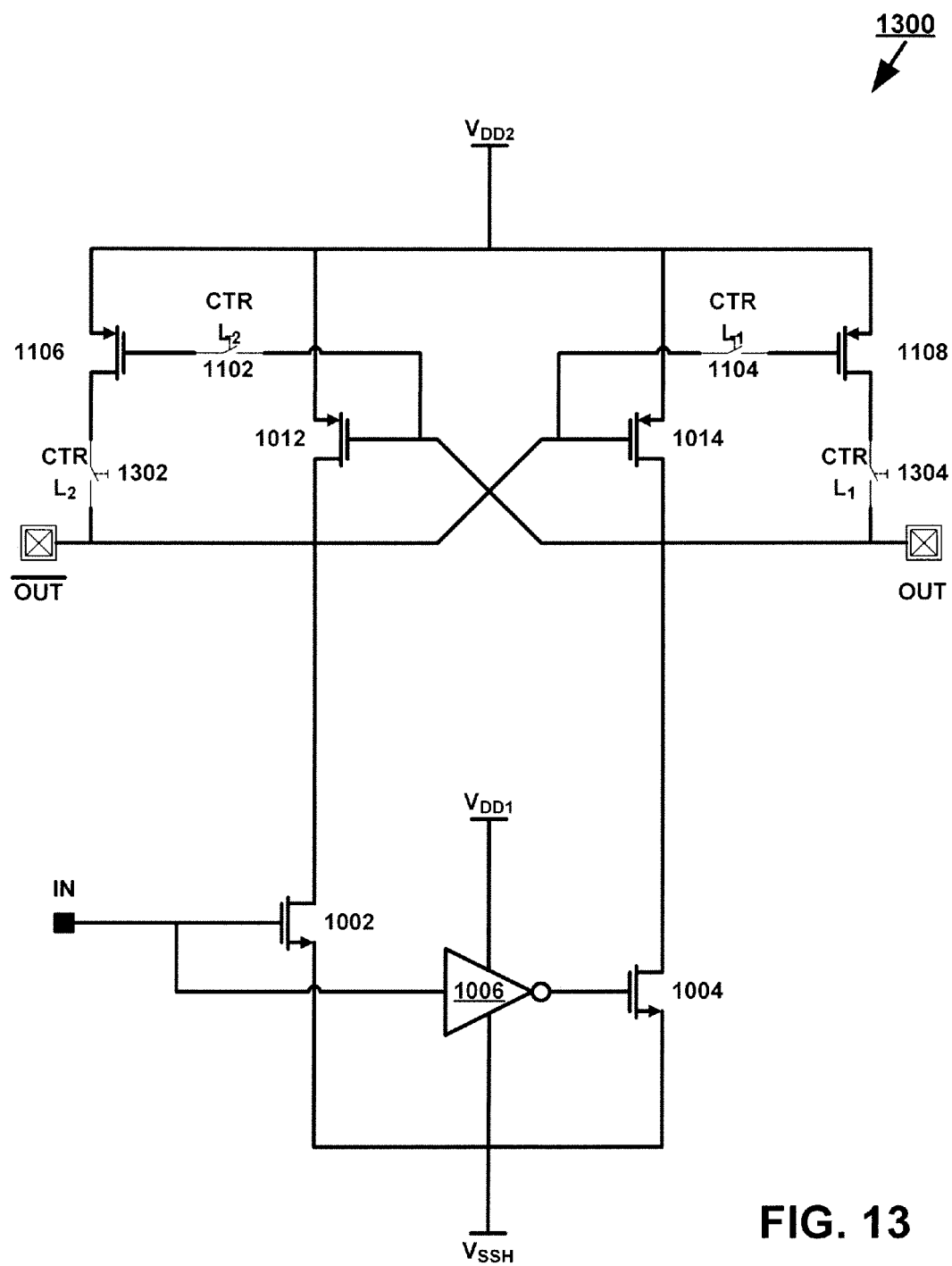
FIG. 13 shows still another exemplary embodiment of a battery assisted level shifter.

FIG. 13 shows yet another exemplary embodiment of a battery assisted level shifter. Like battery assisted level shifter 1100, battery assisted level shifter 1300 comprises pull down NFETs 1002 and 1004, inverter 1006, pull up PFETs 1012 and 1014, strong pull up PFETs 1106 and 1108 and switches 1102 and 1104. Battery assisted level shifter 1300 further comprises switches 1302 and 1304. When the input signal is high, the gate voltage to PFET 1014 is high, turning on PFET 1014. At approximately the same time, control signal $ctrl_1$ goes high, causing switch 1104 and switch 1304 to close, activating PFET 1108 and connecting the source of PFET 1108 to OUT. This state allows PFET 1108 to aid PFET 1014 in pulling up OUT. Meanwhile, NFET 1002 is pulling down $\overline{OUT}$, but it only has to pull down against the impedance of PFET 1012 because control signal $ctrl_2$ received by switch 1302 and by switch 1102 is low, thereby disconnecting PFET 1106 from the level shifter circuit. When the input signal is low, the gate voltage to PFET 1012 is high, turning on PFET 1012. At approximately the same time, control signal $ctrl_2$ causes switch 1102 and switch 1302 to close, activating PFET 1106 and connecting the source of PFET 1106. This state allows PFET 1106 to aid PFET 1012 in pulling up $\overline{OUT}$. Meanwhile, NFET 1004 pulls down OUT, but it only has to pull down against the impedance of PFET 1014 because control signal $ctrl_1$ as received by switch 1104 and switch 1304 is low, thereby disconnecting PFET 1108 from the level shifter circuit.

Control signal $ctrl_1$ should go high approximately when the input signal goes high, and control signal $ctrl_2$ should go high approximately when the input signal goes low. The input signal IN can be used for control signal $ctrl_2$ and its complement $\overline{IN}$ can be used for control signal $ctrl_2$. A control signal which transitions prior to the transition of the input signal will cause the strong PFETs to assist in switching the level shifter. The strong PFETs will draw current before it is needed when that occurs, so it is desirable not to have the control signal transition before the transition in the input signal. A transition in the control signal after the transition in the input signal can benefit the level shifter by having the appropriate strong PFET assist the transition in the level shifter without unduly drawing current prematurely.

Figure 14:
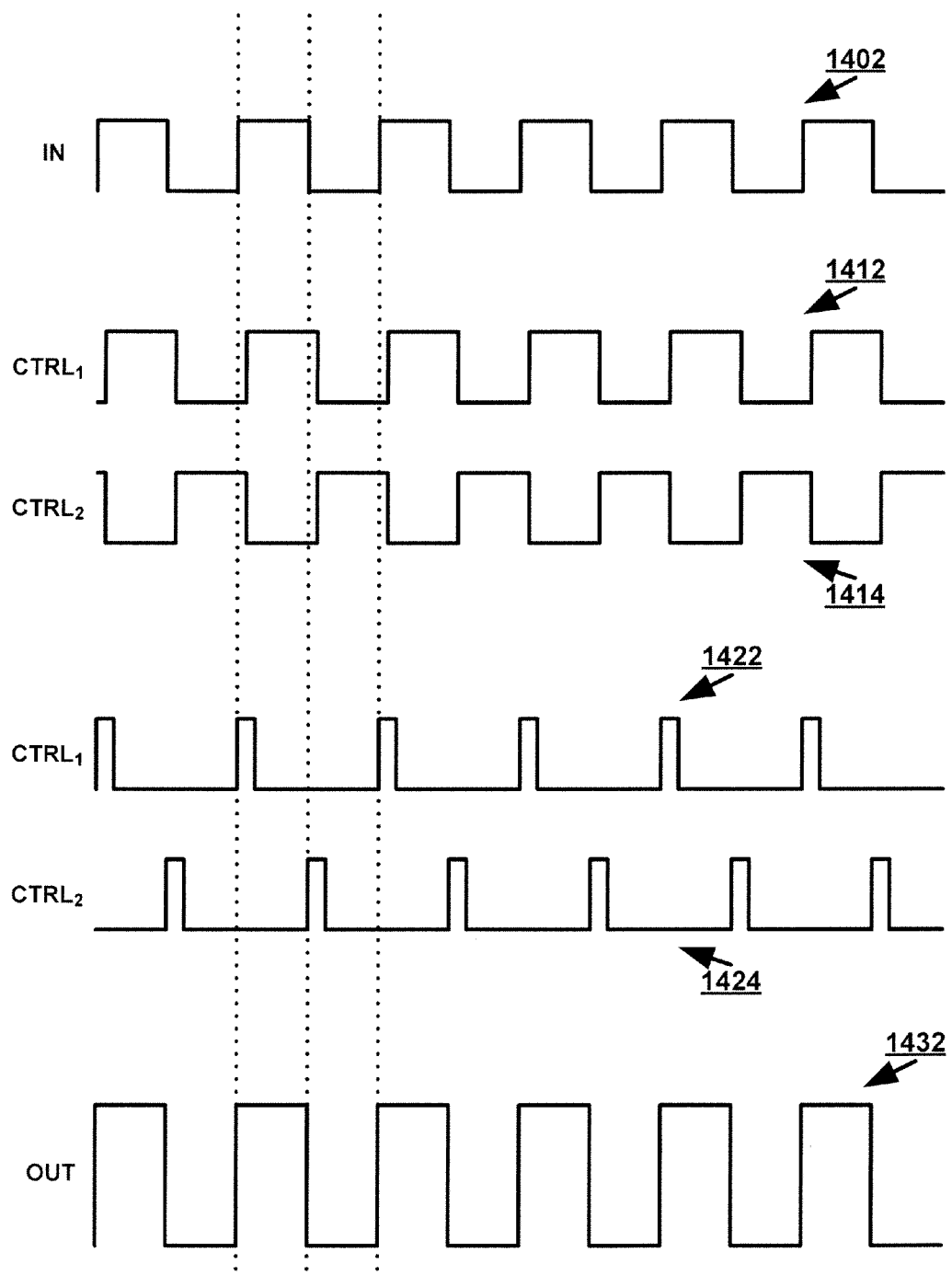
FIG. 14 is a diagram illustrating exemplary signaling used in controlling a battery assisted level shifter.

FIG. 14 is a diagram illustrating exemplary signaling that can be used with battery assisted level shifter 1200 or 1300. Signal 1402 is the input signal to the level shifter. Signal 1412 illustrates an embodiment of control signal $ctrl_1$ and signal 1414 illustrates an embodiment of control signal $ctrl_2$. In this example, control signal $ctrl_1$ and $ctrl_2$ are complementary. Control signal $ctrl_1$ is a version of the input signal delayed by a predetermined delay, but can also be the input signal, i.e., a delay of zero. Because the assistance from the strong PFETs is used only for the transition, they only need to be activated around the time of transitions in the input signal.

Signal 1422 illustrates an alternate embodiment of control signal $ctrl_1$ and signal 1424 illustrates an alternate embodiment of control signal $ctrl_2$. In this example, the respective control signals remain high only for a short predetermined period around transitions from high to low and from low to high. The period of time for each signal to remain high should be approximately long enough for the level shifter to make the transition to the output signal. However, even if the control signal is too short, it still enables the appropriate strong PFET to assist in the transitions in the level shifter.

Signal 1432 is the output signal of the level shifter. In another embodiment, control signal $ctrl_1$ can be OUT and control signal $ctrl_2$ can be $\overline{OUT}$. By tying the control signal to the output signal, the control signal is naturally delayed because the appropriate pull-up PFET has to pull the voltage up enough to enable the switches that activate the strong PFET to assist. The control signal is chosen as a function of simplicity of circuit design, power consumption and other circuit design parameters and objectives.

It should be emphasized that the above-described embodiments are merely examples of possible implementations. Many variations and modifications may be made to the above-described embodiments without departing from the principles of the present disclosure. For example, the bias network could be based on switched-capacitor techniques. Additionally, pull up transistors are represented by PFETs and pull down transistors by NFETs, but other transistor types can be used as well. All such modifications and variations are intended to be included herein within the scope of this disclosure and protected by the following claims.

What is claimed:

1. A circuit comprising:
an inverter coupled to an input and operable to receive an input signal;
a first pull-down transistor coupled to the inverter and operable to pull down an output when the input signal is low;
a second pull-down transistor coupled to the input and operable to pull down a complementary output when the input signal is high;
a first pull-up transistor coupled to the complementary output and operable to pull up the output when the input signal is high;
a second pull-up transistor coupled to the output and operable to pull up the complementary output when the input signal is low;
a first switch operable to receive a first control signal and coupled to the complementary output;
a first strong pull-up transistor coupled to the first switch and operable to assist the pull up of the output;
a second switch coupled to the output and operable to receive a second control signal;
a second strong pull-up transistor coupled to the second switch and operable to assist the pull up of the complementary output;
a third switch coupling the first strong pull-up transistor to the output and operable to receive the first control signal; and
a fourth switch coupling the second strong pull-up transistor to the complementary output and operable to receive the second control signal.

2. The circuit of claim 1, wherein the first strong pull-up transistor is a PFET comprising a drain and a gate and the second strong pull-up transistor is a PFET comprising a drain and a gate, further comprising:
a third switch coupling the gate and the drain of the first strong pull-up transistor and operable to receive a control signal complementary to the first control signal; and
a fourth switch coupling the gate and the drain of the second strong pull-up transistor and operable to receive a control signal complementary to the second control signal.

3. The circuit of claim 1, wherein the first control signal is the input signal delayed by a predetermined delay and the second control signal is a signal that is complementary to the first control signal.

4. The circuit of claim 1, wherein the first control signal is a signal produced by the output and the second control signal is a signal produced by the complementary output.

5. The circuit of claim 1, wherein the first control signal is high for a predetermined period after the input signal transitions from low to high and the second control signal is high for a predetermined period after the input signal transitions from high to low.

6. A circuit comprising:
an inverter coupled to an input and operable to receive an input signal;
a first pull-down transistor coupled to the inverter and operable to pull down an output when the input signal is low;
a second pull-down transistor coupled to the input and operable to pull down a complementary output when the input signal is high;
a first pull-up transistor coupled to the complementary output and operable to pull up the output when the input signal is high;
a second pull-up transistor coupled to the output and operable to pull up the complementary output when the input signal is low;
a first switch operable to receive a first control signal and coupled to the complementary output;
means for assisting the pull up of the output;
a second switch coupled to the output and operable to receive a second control signal;
a second strong pull-up transistor coupled to the second switch and operable to assist the pull up of the complementary output;
a third switch coupling the first strong pull-up transistor to the output and operable to receive the first control signal; and
a fourth switch coupling the second strong pull-up transistor o the complementary output and operable to receive the second control signal.

7. The circuit of claim 6, wherein the first control signal is the input signal delayed by a predetermined delay and the second control signal is a signal that is complementary to the first control signal.

8. The circuit of claim 6, wherein the first control signal is a signal produced by the output and the second control signal is a signal produced by the complementary output.

9. The circuit of claim 6, wherein the first control signal is high for a predetermined period after the input signal transitions from low to high and the second control signal is high for a predetermined period after the input signal transitions from high to low.

10. The circuit of claim 6, wherein the first pull-down transistor coupled to the inverter and operable to pull down the output when the input signal is low comprises means for pulling down the output when the input signal is low.

11. The circuit of claim 6, wherein the second pull-down transistor coupled to the input and operable to pull down the complementary output when the input signal is high comprises means for pulling down the complementary output when the input signal is high.

12. The circuit of claim 6, wherein the first pull-up transistor coupled to the complementary output and operable to pull up the output when the input signal is high comprises means for pulling up the output when the input signal is high.

13. The circuit of claim 6, wherein the second pull-up transistor coupled to the output and operable to pull up the complementary output when the input signal is low comprises means for pulling up the complementary output when the input signal is low.

14. The circuit of claim 6, wherein the second strong pull-up transistor coupled to the second switch and operable to assist the pull up of the complementary output comprises means to assist pulling up of the complementary output.

15. A circuit comprising:
an inverter coupled to an input and operable to receive an input signal;

a first pull-down transistor coupled to the inverter and operable to pull down an output when the input signal is low;

a second pull-down transistor coupled to the input and operable to pull down a complementary output when the input signal is high;

a first pull-up transistor coupled to the complementary output and operable to pull up the output when the input signal is high;

a second pull-up transistor coupled to the output and operable to pull up the complementary output when the input signal is low;

a first switch operable to receive a first control signal and coupled to the complementary output;

a first strong pull-up transistor coupled to the first switch and operable to assist the pull up of the output;

a second switch coupled to the output and operable to receive a second control signal; and a second strong pull-up transistor coupled to the second switch and operable to assist the pull up of the complementary output, wherein the first control signal is the input signal delayed by a predetermined delay and the second control signal is a signal that is complementary to the first control signal.

16. The circuit of claim 15, wherein the first strong pull-up transistor is a PFET comprising a drain and a gate and the second strong pull-up transistor is a PFET comprising a drain and a gate, further comprising:

a third switch coupling the gate and the drain of the first strong pull-up transistor and operable to receive a control signal complementary to the first control signal; and a fourth switch coupling the gate and the drain of the second strong pull-up transistor and operable to receive a control signal complementary to the second control signal.

17. The circuit of claim 15, further comprising:

a third switch coupling the first strong pull-up transistor to the output and operable to receive the first control signal; and a fourth switch coupling the second strong pull-up transistor to the complementary output and operable to receive the second control signal.

18. The circuit of claim 15, wherein the first control signal is a signal produced by the output and the second control signal is a signal produced by the complementary output.

19. The circuit of claim 15, wherein the first control signal is high for a predetermined period after the input signal transitions from low to high and the second control signal is high for a predetermined period after the input signal transitions from high to low.

20. The circuit of claim 15, wherein the first control signal is a signal produced by the output, the second control signal is a signal produced by the complementary output, the first control signal is high for a predetermined period after the input signal transitions from low to high and the second control signal is high for a predetermined period after the input signal transitions from high to low.

* * * * *

UNITED STATES PATENT AND TRADEMARK OFFICE
CERTIFICATE OF CORRECTION

| | |
|---|---|
| PATENT NO. | : 8,421,518 B2 |
| APPLICATION NO. | : 13/044378 |
| DATED | : April 16, 2013 |
| INVENTOR(S) | : Christian Larsen |

Page 1 of 1

It is certified that error appears in the above-identified patent and that said Letters Patent is hereby corrected as shown below:

In the Claims

Column 10, line 29, replace "o" with "to"
Column 11, line 29, replace "agate" with "a gate"

Signed and Sealed this
Twenty-fifth Day of June, 2013

Teresa Stanek Rea
*Acting Director of the United States Patent and Trademark Office*